US011262381B2
:::

(12) United States Patent
Torreiter et al.

(10) Patent No.: US 11,262,381 B2
(45) Date of Patent: Mar. 1, 2022

(54) DEVICE FOR POSITIONING A SEMICONDUCTOR DIE IN A WAFER PROBER

(71) Applicant: INTERNATIONAL BUSINESS MACHINES CORPORATION, Armonk, NY (US)

(72) Inventors: Otto Andreas Torreiter, Leinfelden-Echterdingen (DE); Jörg Georg Appinger, Aidlingen (DE); Martin Eckert, Moetzingen (DE); Quintino Lorenzo Trianni, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 16/739,509

(22) Filed: Jan. 10, 2020

(65) Prior Publication Data

US 2021/0215738 A1 Jul. 15, 2021

(51) Int. Cl.
*G01R 1/04* (2006.01)
*G01R 31/28* (2006.01)

(52) U.S. Cl.
CPC ....... *G01R 1/0408* (2013.01); *G01R 31/2831* (2013.01)

(58) Field of Classification Search
CPC .......................... G01R 1/0408; G01R 31/2831
USPC ...................................................... 324/750.2
See application file for complete search history.

(56) References Cited

U.S. PATENT DOCUMENTS

| | | | |
|---|---|---|---|
| 6,127,254 A * | 10/2000 | Diebold | G01R 31/2887 257/E21.511 |
| 6,466,046 B1 * | 10/2002 | Maruyama | H01L 21/67126 324/754.15 |
| 7,026,833 B2 | 4/2006 | Rincon | |
| 8,531,202 B2 | 9/2013 | Mok | |
| 9,977,053 B2 | 5/2018 | Appinger | |
| 2008/0221712 A1 * | 9/2008 | Johnson | G05B 19/402 700/56 |
| 2011/0001780 A1 * | 1/2011 | Amidon, Jr. | B41J 2/1752 347/44 |
| 2014/0203829 A1 * | 7/2014 | Yamada | G01R 31/2863 324/750.08 |
| 2015/0201537 A9 | 7/2015 | Eckert | |

FOREIGN PATENT DOCUMENTS

| | | |
|---|---|---|
| CN | 206930744 U | 1/2018 |
| CN | 208314134 U | 1/2019 |
| JP | 10025455 A | 1/1998 |
| JP | 2013023103 A | 1/2013 |
| JP | 2013214749 A | 10/2013 |

* cited by examiner

*Primary Examiner* — Jermele M Hollington
*Assistant Examiner* — Courtney G McDonnough
(74) *Attorney, Agent, or Firm* — Kristofer L. Haggerty

(57) ABSTRACT

The invention relates to a device for positioning a semiconductor die in a wafer prober, the device comprising a carrier plate and a clamp on a front surface of the carrier plate, the dimensions of the carrier plate matching a standard geometry required by the wafer prober for receiving a semiconductor wafer to be probed by the wafer prober, the clamp being reversibly movable against a force of an elastic element between an open position and a closed position, the clamp being adapted for fixing the die on the carrier plate in the closed position and for releasing the die in the open position.

18 Claims, 2 Drawing Sheets

DEVICE FOR POSITIONING A SEMICONDUCTOR DIE IN A WAFER PROBER

BACKGROUND

The present invention relates generally to the manufacturing of semiconductor devices and, more particularly, to the testing of completed semiconductor devices before their encapsulation into a packaging.

Today's semiconductor devices are usually manufactured as multiple dies (commonly also referred to as die, dice or chips) that are formed in parallel on a large, even, thin, often circular or clipped circular semiconductor wafer. After manufacturing of the devices, they are tested for the first time on the still intact, undiced wafer before the wafer is cut into typically rectangular pieces representing the single dies. These chips usually need to be mounted onto a module substrate (e.g., by a solder process) that typically consists of a ceramic or organic material, before it can be connected again to another test system or even plugged into the final product.

Electronic circuits formed on a wafer are typically tested using a wafer test prober that consists of an automatic wafer loader adapted for picking single wafers out of a wafer cartridge, a theta pre-align system to adjust the in-plane wafer rotation, a chuck onto which the single wafer gets loaded, and a wafer prober unit comprising a probe card with electrical contacting pins. The position of the chuck can usually be set with a micrometer-range precision in three independent spatial directions x, y, z; the chuck may further be thermally controlled and connected to a vacuum system so the wafer can be secured to the chuck using an underpressure on its front side. After establishing an electrical contact to the die contacts using the probe card, the functioning of the dies can be tested using, e.g., automated test equipment.

The configuration and dimensions of a wafer test prober and its units may specifically support wafers of a given industry standard such as 200-millimeter (200-mm; also known as "8-inch") silicon wafers having a thickness of 725 micrometers ($\mu m$) and a weight of 53 grams (g), or 300-mm ("12 inch") silicon wafers having a thickness of 775 $\mu m$ and a weight of 125 g.

SUMMARY

In one aspect, the invention relates to a device for positioning a semiconductor die in a wafer prober, the device comprising a carrier plate and a clamp on a front surface of the carrier plate, the dimensions of the carrier plate matching a standard geometry required by the wafer prober for receiving a semiconductor wafer to be probed by the wafer prober, the clamp being reversibly movable against a force of an elastic element between an open position and a closed position, the clamp being adapted for fixing the die on the carrier plate in the closed position and for releasing the die in the open position.

Embodiments of the invention are given in the dependent claims. Embodiments of the present invention can be freely combined with each other if they are not mutually exclusive.

BRIEF DESCRIPTION OF THE SEVERAL VIEWS OF THE DRAWINGS

In the following, embodiments of the invention are explained in greater detail, by way of example only, making reference to the drawings in which.

DETAILED DESCRIPTION

Figure 1:
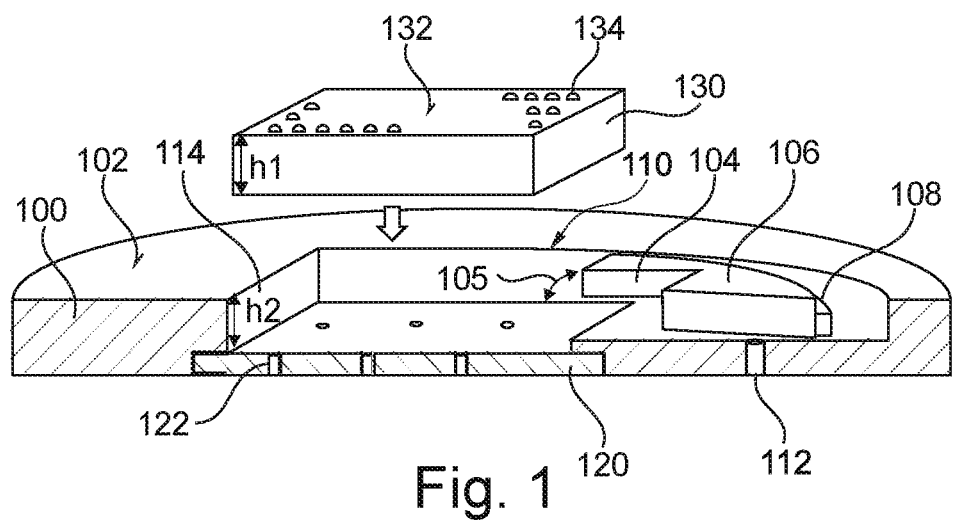
FIG. 1 is a schematic sectional drawing of a device for positioning a semiconductor die in a wafer prober.

After testing a given electronic circuit as a part of the wafer, the next opportunity to test the circuit with electrical contact is typically after the wafer has been diced and the individual die containing the circuit has been mounted on a module substrate. The module substrates may be a chip carrier, which usually includes soldering, or after packaging at a later point in production. In some situations, such as making electronical devices from single dies that are left over from an earlier production, quality control may require to test single dies that have already been detached from the wafer before the manufacturing is continued. Therefore, it is desirable to have a means that allows for an earlier and simpler testing of single semiconductor dies.

In the context of the present disclosure, the terms "die" and "chip" both refer to a general fraction of a semiconductor wafer that contains a complete electric or electronic circuit. In particular, a die does not necessarily have to be rectangular; for instance, the term "die" may likewise refer to a quarter wafer to be tested in a wafer prober.

The device for positioning a semiconductor die in a wafer prober allows for doing so by fixing the die to a carrier plate. A carrier plate (which may be sometimes referred to as "the plate" and is distinct from the feature "vacuum plate" described herein) is understood herein as a rigid object that extends primarily in a plane, where primarily means that its largest overall dimension perpendicular to the plane (its thickness) is small (at least by a factor of ten) compared to the plate's smallest overall dimension inside the plane. Unless where otherwise noted, any boundaries of the plate extending in the direction of the thickness of the plate are not considered as a surface herein. Hence, the plate comprises a front surface (the surface where the clamp is installed) and a back surface facing away from the front surface.

The shape of the carrier plate resembles that of a semiconductor wafer as it is used, e.g., in the production of integrated electronics. Semiconductor wafers to be diced into individual chips are usually manufactured with a geometry according to a public industry standard. Such wafer geometry typically comprises a circular perimeter or a perimeter comprising a circular section and a straight section that is a secant to the full circle containing the circular section. For instance, a standard wafer size presently used for silicon wafers defines a circular perimeter with a diameter of 300 mm (11.8 inch, usually referred to as "12 inch"), and a thickness of 775 $\mu m$, which corresponds to a total wafer weight of 125 grams and allows for making 640 quadratic dies with an edge length of 10 mm. It is emphasized that the carrier plate's resemblance of a semiconductor wafer at least relates to its geometry inside the plane, i.e., its overall dimensions and the shape of its perimeter. The thickness of the carrier plate may not necessarily be equal to the thickness according to the industry standard that is followed for the in-plane geometry of the carrier plate.

The device allows for fixing the die to the carrier plate using the clamp. This means that the motion of the die resting on the carrier plate is restricted in the direction perpendicular to the front surface and at least in one direction parallel to the front surface. Within this disclosure, the term "horizontal" describes any direction that is parallel to the front surface, which includes two mutually perpendicular directions "x" and "y". Likewise, the term "vertical" describes the directions that are perpendicular to the front surface, which includes the direction "z".

The interaction between the elastic element and the clamp may be chosen to form either a self-opening clamp (where an external force has to be exerted on the elastic element via the clamp in order to transfer the clamp into the closed position) or a self-closing clamp (where an external force has to be exerted on the elastic element via the clamp in order to transfer the clamp into the open position). In particular, the elastic element may be adapted for restoring the clamp into the open position, wherein the device further comprises a clamp lock (e.g., a latching mechanism) that is adapted for reversibly fixing the clamp in the closed position, thus preventing the clamp in the closed position from being restored by the elastic element. However, it may be recommendable to manufacture the clamp in a self-closing configuration so that it may be unnecessary to install a clamp lock on the carrier plate. Hence, the self-closing configuration may have an advantage in terms of simplicity of manufacture and device as well.

For a self-opening clamp, the open position of the clamp is usually determined by its construction, e.g., by a structure hindering the clamp from further movement away from the closed position or by relaxation of the elastic element. A self-opening clamp is moved into the closed position by an external force and must be kept in the closed position by a clamp lock fixed to the carrier plate. For a self-closing clamp, the open position is determined by the magnitude and direction of an external force that comprises a component pointing away from the direction of restoral defined by the elastic element's action on the clamp. For both a self-closing and a self-opening clamp, the closed position is determined by the particular geometry of the die to be fixed to the carrier plate and is characterized by a limitation of a further movement of the clamp caused by immediate contact of the die and/or the clamp with an obstacle that is part of the carrier plate or in rigid connection with the carrier plate.

Embodiments of the invention may have the advantage of enabling electrical tests of a single die, that is detached from the semiconductor wafer within which the die was originally formed, in an existing wafer prober. This may be a consequence of the prerequisite that the dimensions of the carrier plate match a standard geometry that is required by the wafer prober for receiving a semiconductor wafer to be probed by the wafer prober. This may enable the prober's automatic wafer loader to draw the device from a wafer cartridge. Afterwards, the pre-align system may rotate the device into a predefined orientation required for performing the test, and the device may get loaded on the wafer chuck. The chuck may perform a precise alignment of the device with a probe card installed in the prober so that the electrical contacts of the die may be connected to the contacting needles of the probe card.

Said precise alignment of the die, e.g., with an accuracy of 20 micrometers (μm) in x and y direction, relative to the probe card may be achieved in different ways. For example, the device may be constructed under the assumption that the dicing method employed to separate the die from its original wafer is precise enough that the positions of the die's electrical contacts relative to its boundaries are known. In this case, the closed position of the clamp may be defined precisely, e.g., using a stop structure and/or by precise positioning of the clamp itself, so that the electrical contacts of different dies may always be found at a subset of matrix dots defined by the precise closed position. The closed position may be defined with high precision, e.g., relative to the perimeter of the plate and/or an alignment mark on the plate. In another example, device is constructed under the assumption that the die itself is equipped with one or more alignment marks such as saw marks from the dicing process and the positions of the die's electrical contacts are known relative to the die's alignment marks and the wafer prober is capable of positioning the chuck with high precision using the die's alignment mark(s) and optionally an alignment mark on the carrier plate. In this case, the clamp may be located at an arbitrary position.

Due to its rigidity, the carrier plate may provide the further advantage of mechanically supporting the die, which may be useful to prevent the die from bending and/or getting damaged by the high pressure that is typically exerted on the chip by the contactor of the wafer prober unit. Typical force values built up by wafer probers using probe cards with between 1000 and 10000 contact needles on wafers with a nominal surface between 100 and 200 square centimeters ($cm^2$) may range between 1000 and 200 newton (N) in order to obtain an effective force per contact in the millinewton (mN) range.

The clamp may secure the chip in the closed position and may thus allow a safe transport of the device holding the die, for instance, between a wafer cartridge and the chuck. In the open position, the die may allow for an easy exchange of the die. Depending on the construction, the clamp may also prevent the die from slipping while being exerted to said high pressures during testing. The device may comprise multiple clamps that are movable against separate elastic elements in different nonparallel directions to fix a single die in two independent degrees of freedom in the closed position.

According to an embodiment, the device further comprises a vacuum plate attached to the clamp and resting on the carrier plate, the carrier plate further comprising one or more first vacuum ducts covered by the vacuum plate in the closed state. On a wafer chuck with vacuum capability, the air between the back surface of the device and the chuck may be removed so that the device is pressed onto the chuck by atmospheric pressure. The first vacuum ducts may allow for a further removal of air between the vacuum plate and the front surface of the carrier plate so that the vacuum plate is pressed onto the front surface by atmospheric pressure. This may provide the clamp with further stability in the horizontal directions and may thus further reduce the risk of vertical slipping of the die during testing.

According to an embodiment, the vacuum plate covers at least 25 percent of the front surface. A larger vacuum plate may take up the atmospheric pressure over a larger surface and may thus aggregate a higher adhesive force between the vacuum plate and the front surface. Hence, a larger horizontal force may be necessary to overcome said adhesion, i.e., there may be a lower risk of losing electrical contact during testing due to horizontal slipping of the die in response to the contacting pressure between the chuck and the wafer prober unit.

According to an embodiment, the device further comprises a stop structure, the clamp being movable toward and away from the stop structure along a degree of freedom parallel to the front surface, the clamp being adapted for fixing the die on the carrier plate in the closed position by pressing the die against the stop structure. A stop structure may be any barrier that may be fixed to the carrier plate or formed by the material of the carrier plate itself and against which the die may be pressed in the closed position. This may require that the clamp is adapted for pressing the die against the stop structure in a horizontal or lateral direction. In this way, the clamp may not require space on the back of the die for performing the clamping function and may thus fix the die to the carrier plate while giving clearance between the die's electrical contacts and the probe card. Furthermore, such horizontal clamp may enable a reduced vertical bending of the die due to lacking external forces acting on the back of the die.

According to an embodiment, the front surface comprises a recess forming the stop structure, the recess having a uniform depth of less than an overall wafer thickness specified by the standard geometry. In an example, this is achieved by the overall thickness of the plate being equal to a standardized wafer thickness and by forming the recess, e.g., by milling the front surface without breaking through the back surface, so that a die inserted into the recess may extend vertically above the front surface. In another example, an opening is formed through the plate having a standard wafer thickness and is covered by a base plate or base foil comprising a thickening in the area of the opening so that the thickening extends into the opening and a chip placed upon the thickening may extend vertically beyond the front surface. In another example, the plate is thinner than a standardized wafer thickness at least in a local environment around the recess so that a die inserted into the recess may extend vertically above the thinner area.

Hence, the depth of the recess may be less than the thickness of the die, which may have the effect that solder bumps that may be located on the back side of the die for electrically contacting the die's electric or electronic circuit are located on the highest vertical level while the die is inserted into the recess. In this way, the pressure of the contactor needles of a probe card installed in the wafer prober may be maximized during the testing of the die, which may result in a high mechanical stability of the electrical testing connections thus formed and may reduce the contact resistances between the contactor needles and the solder bumps.

According to an embodiment, in the area of the recess, the material of the carrier plate is replaced by a material having a higher thermal conductivity than the carrier plate. This may provide an improved thermal coupling between the die and the chuck and may be particularly beneficial if the chuck is equipped with a surface cooling system. An improved thermal coupling of the die may increase dissipation of heat set free during the testing and may thus allow to test the die at an increased or full release of thermal energy going along with high electronic performance. The base cover may consist of a thin material capable of providing a good thermal contact (e.g., a base plate or base foil made of copper or gold) that is fixed, in an example, to the back side of the carrier plate, or, in another example, to the front surface and is lowered into the opening so that it can receive the die from the front surface.

According to an embodiment, the stop structure protrudes from the front surface. This may provide a manufacturing advantage by enabling an attachment of the protruding structure, e.g., by gluing, and/or by allowing for manufacturing the protruding stop structure with lower requirements regarding machining precision.

According to an embodiment, the stop structure comprises two nonparallel straight segments, the clamp being adapted for fixing the die on the carrier plate in the closed position by simultaneously pressing the chip against both of the segments. This may allow for fixing the die to the front surface in two nonparallel directions. This does not necessarily mean that the two segments are adjoining or connected to each other; it may rather be that the two segments are approaching each other without contacting each other. In this case, the gap between the two segments should be smaller than an anticipated minimum size of the chip to be tested such that the stop structure is effective for all anticipated chip sizes. Preferably, the segments enclose a right angle so that a rectangular die may flatly adjoin each segment while being fixed. This may minimize stress within the chip in the closed position by homogeneously distributing the forces exerted on the chip by the clamp, and may thus reduce the risk of damaging the chip during single-die testing.

According to an embodiment, the degree of freedom comprises a translation. A translational degree of freedom comprises a linear motion of the clamp guided by the elastic element and may be realized using an extension spring or a compression spring, preferably a spiral spring, and optionally further means such as a guiding groove or rail. A spiral spring, for instance, may enable a fixture of the die to the carrier plate by means of a linear movement of the clamp, which may result in a reduced dependence of the die geometry.

The degree of freedom of the elastic element may generally comprise, e.g., a rotation or a translation. More generally, the clamp may have more than one degree of freedom and may feature, for instance, two non-parallel translations, two rotations about non-parallel axes, or a combination of a translation and a rotation. In particular, alternatives to a linear motion of the clamp may be possible, e.g., by designing the elastic element as a cantilever spring, but this would have a rotational degree of freedom that might restrict the geometry of the dies that can be fixed to the stop structure due to differences in the contact angle between the clamp and the die. On the other hand, an advantage of a cantilever spring may comprise a simpler design and may yet be beneficial if the dies to be tested are anticipated to have a uniform (e.g., standardized) geometry. A cantilever spring may be attached to the carrier plate e.g. by welding or gluing, which may have a lower risk of accidentally getting detached from the plate and may thus provide the clamp with an improved mechanical stability.

According to an embodiment, the front surface comprises a receiving area, the clamp being adapted, in the closed position, for bringing the die into contact with the receiving area, the device further comprising one or more second vacuum ducts in the receiving area. On a wafer chuck with vacuum capability, this may provide an additional protection of the die from horizontal slipping in response to the contact pressure between the chuck and the contactor of the prober unit.

According to an embodiment, the second vacuum ducts cover between 1 and 50 percent of the receiving area. A relative vacuum duct coverage of the receiving area of at least 1% may result in an improved vacuum efficiency, and a coverage of up to 50% may ensure a sufficient mechanical stability of the receiving area.

According to an embodiment, the clamp comprises a first rectangular frame adapted for receiving the die in a first rectangular area surrounded by the first rectangular frame. This may enable a horizontal fixture of the die to the carrier plate. In particular, the rectangular shape of the clamp frame may provide a continuous border structure for establishing a mechanical contact to the die and may thus provide an effective fixture with a reduced dependence of the die geometry. For instance, the rectangular frame may also be used for securely fixing a die with curved edges.

According to an embodiment, the device further comprises a frame shell, the frame shell comprising a base element fixed to the front surface and a second rectangular frame fixed to the base element, the second rectangular frame being stacked on the base element, the first rectangular frame being received between the base element and the second rectangular frame and being movable relative to the frame shell along a degree of freedom parallel to the front surface, the frame shell having, when receiving the first rectangular frame, an overall thickness of less than an overall wafer thickness specified by the standard geometry, the device being adapted for simultaneously receiving the die in the first rectangular area and a second rectangular area surrounded by the second rectangular frame, the first rectangular frame being adapted for fixing the simultaneously received die on the carrier plate in the closed position by pressing the die against the frame shell.

The base element may serve as a base for the second rectangular frame that can, e.g., be glued to the carrier plate so the carrier plate does not have to be damaged to install the second rectangular frame. The base element may be, without limitation, a slide plate or a further frame upon which the first rectangular frame rests and that allows the first rectangular frame to slide during its movement between the open position and the closed position. The second rectangular frame may serve at least as a vertical guide for the first rectangular frame; possibly the connection(s) between the second rectangular frame and the base element may also serve as a horizontal guide for the first rectangular frame. The first rectangular frame does not need to have the same orientation as the second rectangular frame, but may inherit its orientation, e.g., when fixing a rectangular die to the frame shell due to the geometry of the die. In the closed position, the first rectangular frame presses the die against the frame shell, i.e., at least against the second rectangular frame. The base element and the second rectangular frame should have smooth and even surfaces, allowing the first rectangular frame to slide between the base element and the second rectangular frame with low friction.

According to an embodiment, the base element comprises a third rectangular frame surrounding a third rectangular area, the device being adapted for simultaneously receiving the die in the first, the second and the third rectangular area, a first aligned edge of the second rectangular frame being aligned with a second aligned edge of the third rectangular frame, the first rectangular frame being adapted for fixing the simultaneously received die on the carrier plate in the closed position by simultaneously pressing the die against the first aligned edge and the second aligned edge.

The frame shell comprises at least one pair of aligned edges, namely a first aligned edge of the second rectangular frame bordering the second rectangular area and a second aligned edge of the third rectangular frame bordering the third rectangular area, for simultaneously receiving the die in the closed position. In this case, the contact pressure exerted on the die by the first rectangular frame may be distributed symmetrically through the vertical extension of the die, which may reduce the risk of deforming or damaging the die.

According to an embodiment, the elastic element is adapted for restoring the clamp into the closed position. Hence, the clamp is in a self-closing configuration and it may therefore be unnecessary to provide the device with an additional clamp lock (such as a latching mechanism). Furthermore, the self-closing configuration may ensure that the die is automatically fixed to the carrier plate as soon as the external force counteracting the restoring force of the elastic element that is needed to move the clamp into the open position ceases. The self-closing configuration may also simplify an adaption of the closed position to the specific geometry of the particular die to be fixed, so this adaptation may not have to be performed manually.

According to an embodiment, the clamp is exchangeably mounted on the carrier plate. This may allow for using multiple clamps of different geometries so that a best-matching clamp geometry may be chosen for fixing a given die. This may allow for using the device with a higher flexibility and may enable to fix various dies of changing geometries with a clamping pressure that distributes more uniformly through the body of the die.

According to an embodiment, the carrier plate further comprises an alignment mark. One or more alignment marks may be detected by logics usually onboard the wafer prober via an optical device (e.g., an image sensor or a laser scanner installed in the wafer prober). In response to a successful detection of an alignment mark, the logics may cause the respective actuator(s) of the chuck drive and/or the theta pre-align system to compensate a detected deviation of the alignment mark(s) from a predefined nominal orientation and/or position for testing. This may enable a more precise orientation of the device in the theta degree of freedom (i.e., in-plane rotation) and/or a more precise adjustment in the x/y degrees of freedom.

According to an embodiment, the carrier plate is a semiconductor wafer or is made of a metal or a ceramic material. Using a semiconductor wafer as the carrier plate may have the advantage that the requirement of the plate geometry matching a standard wafer geometry can be fulfilled without further ado and that it may be unnecessary to manufacture a dedicated part as the carrier plate. For instance, the semiconductor wafer may be a blank semiconductor wafer or a partially or fully processed wafer that has been abandoned from further manufacturing, which may provide an availability advantage. Metals (including alloys such as stainless steel) and ceramics may provide a simple and highly variable machinability in connection with the required rigidity to support the die under the high mechanical load of the testing equipment. Ceramics may provide the possibility to form all rigid parts of the device, such as the stop structure, in a single manufacturing step as a single piece that does not have to be assembled. Preferably, the material of the carrier plate has a high thermal conductivity (e.g., comparable to copper or aluminum), which may allow a fast dissipation of heat that may be generated during the testing of the die.

According to an embodiment, the metal is aluminum.

Aluminum has an atomic weight of 13 atomic mass units (a.m.u.), which is close to the atomic weight of a silicon wafer (14 a.m.u.). Thus, an aluminum carrier plate may be handled comparably safely by an automatic transfer device of the wafer prober that may be designed for the weight of a standard wafer. In addition, an aluminum carrier plate may provide a higher thermal conductivity than, e.g., stainless steel and may therefore be more suitable for testing the die under full workload.

According to an embodiment, the elastic element has a spring constant between 0.025 and 0.5 newton per millimeter. For illustration, the weight of an exemplary rectangular single-circuit die cut from a 300-mm wafer may be around 3 g, which corresponds to a force of about 0.03 N. Therefore, a spring constant within the given range may allow for moving the received die into the closed position by overcoming its weight as well as pressing the die to the respective obstacle receiving the die in the closed position and counteracting the force exerted on the die by the elastic element via the clamp without deforming or damaging the die. The lower part of the range may allow for fixing smaller or lighter dies that may include electronic circuits of comparably small dimensions, while the higher part of the range may be suitable for larger or heavier dies, including those that may become diced from a semiconductor wafer according to a possible future standard (such as the proposed 450-mm wafer that is expected to have a chip weight of about 230 milligrams (mg) per 10-mm square die, compared to 195 mg for chips made from a 300-mm wafer).

Now turning to the drawings, FIG. 1 is a schematic sectional drawing of an exemplary device for positioning a semiconductor die 130 in a wafer prober. The device comprises a carrier plate 100 and a clamp 104 that is fixed to a front surface 102 of the carrier plate 100. The clamp 104 is movable between an open position and a closed position against a restoring force of an elastic element 108 along a rotational degree of freedom 105 that is indicated by a double arrow in the drawing. The clamp 104 and the elastic element 108 may be constructed to form a self-closing configuration where an external force is needed to overcome the restoring force of the elastic element 108 to move the clamp 104 from the closed position to the open position. Alternatively, the clamp 104 and the elastic element 108 may be constructed to form a self-opening configuration where an external force is needed to overcome the restoring force of the elastic element 108 to move the clamp 104 from the open position to the closed position. In the latter case, the device should further comprise a clamp lock (not shown) to reversibly keep the clamp 104 in the closed position.

Attached to the clamp 104 is a vacuum plate 106 that is covering a first vacuum duct 112 establishing pneumatic connection between the vacuum plate 106 and the back side of the carrier plate 100. Without limitation, the carrier plate 100 may comprise multiple ones of the first vacuum duct 112 that can be thought of as being hidden from view in the drawing.

A recess 110 adapted for receiving the die 130 is formed in the front surface 102. The recess is formed by an opening in the carrier plate 100 and forms a stop structure 114 against which the received die 130 can be pressed by the clamp 104 in the closed position. The recess 110 is closed from the back side by a base seal 120. The base seal 120 is made of a material with a higher thermal conductivity than the material of the carrier plate 100. The base seal 120 comprises several second vacuum ducts 122 that establish a pneumatic connection between the recess 110 and the back side of the carrier plate 100.

The depth of the recess 110, i.e., the vertical distance $h_2$ between the base seal 120 and the front surface 102, is smaller than a minimum thickness $h_1$ of any die 130 that is anticipated to be received by the recess 110 for testing in the wafer prober. This may have the effect that the solder bumps 134 that are located on the back side 132 of the die 130 for electrically contacting the electronic circuit of the die 130 are located on the highest vertical level while the die 130 is inserted into the recess 110. In this way, the pressure of the contactor needles of a probe card installed in the wafer prober may be maximized during the testing of the die 130, which may result in a high mechanical stability of the electrical testing connections thus formed and may reduce the contact resistances between the contactor needles and the solder bumps 134.

In the special case shown in FIG. 1, the clamp 104 comprises an inner contour that faces the recess 110 and encloses a right angle, which may allow for an effective fixture of a rectangular die 130. In the special case shown in FIG. 1, the elastic element 108 is a cantilever spring and the degree of freedom 105 is a rotation.

An exemplary usage scenario of the device comprises placing the die 130 on the base seal 120 of the recess 110, fixing the die 130 by moving the clamp 104 into the closed position or allowing the clamp 104 to move into the closed position, placing the device on a wafer chuck of the wafer prober, additionally fixing the die 130 and the vacuum plate 106 by evacuating the clearance between the chuck and the device, bringing the device into contact with a contactor (probe card) of a wafer prober unit of the wafer prober such that the needles of the probe card form stable electrical contacts with the solder bumps 134, and performing an automated testing routine on the electric or electronic circuitry hosted by the die 130 using an automated testing device to which the contactor needles are electrically connected.

Figure 2:
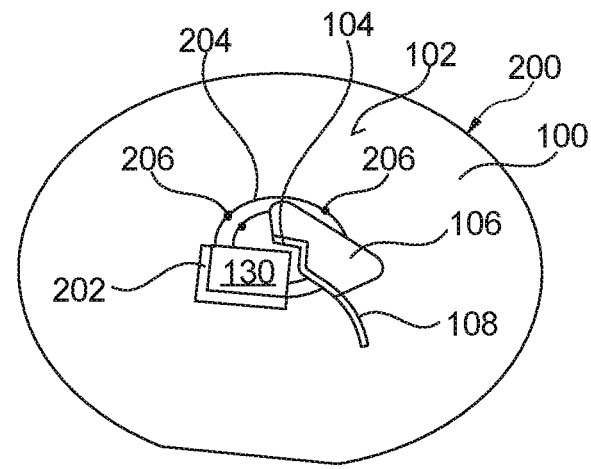
FIG. 2 is a schematic top view of a device for positioning a semiconductor die in a wafer prober with the clamp in the open position.

FIG. 2 is a schematic top view of another exemplary device for positioning a semiconductor die 130 in a wafer prober. In the drawing of FIG. 2, it can be seen that the perimeter 200 of the carrier plate 100 resembles the standardized perimeter of a semiconductor wafer comprising a circular section and a straight section that is a secant to the full circle containing the circular section.

An "L"-shaped stop structure 202 is fixed to the front surface 102. The right angle enclosed by the stop structure 202 borders a receiving area of the front surface 102 adapted for receiving a die 130 and faces the clamp 104 and a pair of concentric grooves 204 formed around the center of the circular portion of the contour 200. Embedded into the grooves 204 are several vacuum ducts 206 that serve as the first vacuum ducts 112 (in the drawing covered by the vacuum plate 106) and second vacuum ducts 122 (covered by the die 130).

In the drawing of FIG. 2, a rectangular die 130 has been placed on the receiving area such that two edges of the die 130 are contacting the stop structure 202. The edges of the clamp 104 facing the die 130 and the stop structure 202 are formed by an extension of a cantilever spring 108. The clamp 104 is shown in the open position, which can be seen by a gap between the die 130 and the clamp 104.

Figure 3:
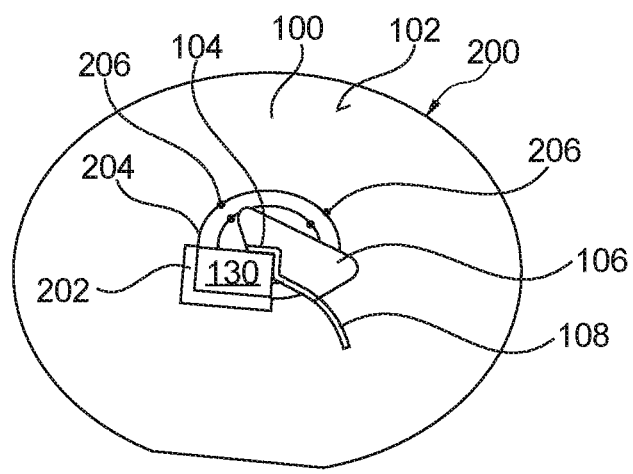
FIG. 3 is a schematic top view of a device for positioning a semiconductor die in a wafer prober with the clamp in the closed position.

FIG. 3 is a schematic top view of the device of FIG. 2, wherein the clamp 104 is now in the closed position (the gap seen in FIG. 2 between the die 130 and the clamp 104 has vanished). The clamp 104 fixes the die 130 to the carrier plate 100 by pressing the die 130 against the edges of the stop structure 202 enclosing the right angle and facing the receiving area. This may allow for safely transporting the die 130 e.g. between a wafer cartridge of the wafer prober and the chuck.

Figure 4:
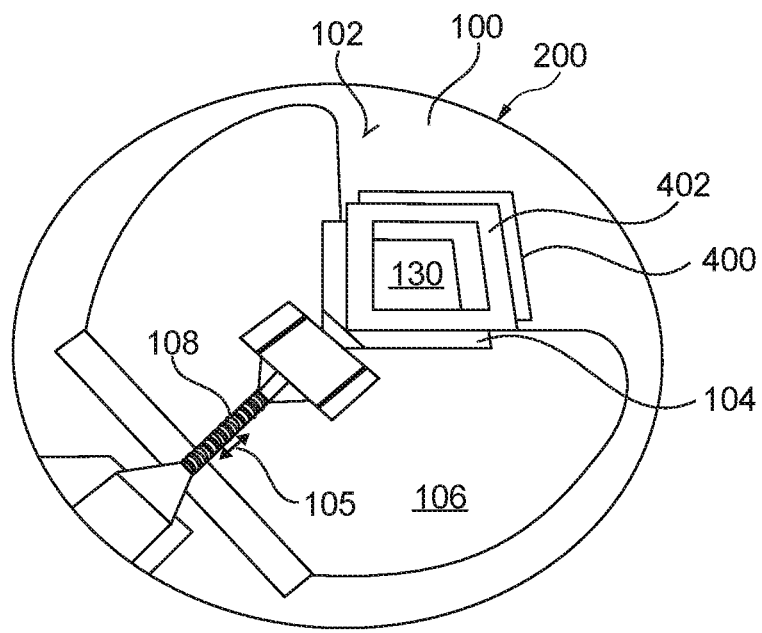
FIG. 4 is a schematic top view of a device for positioning a semiconductor die in a wafer prober comprising a frame shell.

FIG. 4 is a schematic top view of another exemplary device for positioning a semiconductor die in a wafer prober. The device depicted in FIG. 5 comprises a spiral spring that allows for moving the clamp 104 along a linear degree of freedom 105. The clamp 104 is formed by a first rectangular frame enclosing a first rectangular area adapted for receiving a die 130. Attached to the clamp 104 is again a vacuum plate 106 which now covers about 40 percent of the front surface 102.

The first rectangular frame 104 is received by a frame shell 400, 402 comprising a base element 400 and a second rectangular frame 402 surrounding a second rectangular area adapted for receiving a die 130. The base element 400 is fixed to the carrier plate 100 and the second rectangular frame 402 is fixed to the base element 400 at a vertical distance, allowing the first rectangular frame 104 to slide between the base element 400 and the second rectangular frame 402. The first and second rectangular areas overlap so that the die 130 shown in FIG. 4 is simultaneously received by the first rectangular frame 104 and the second rectangular frame 402.

Figure 5A:
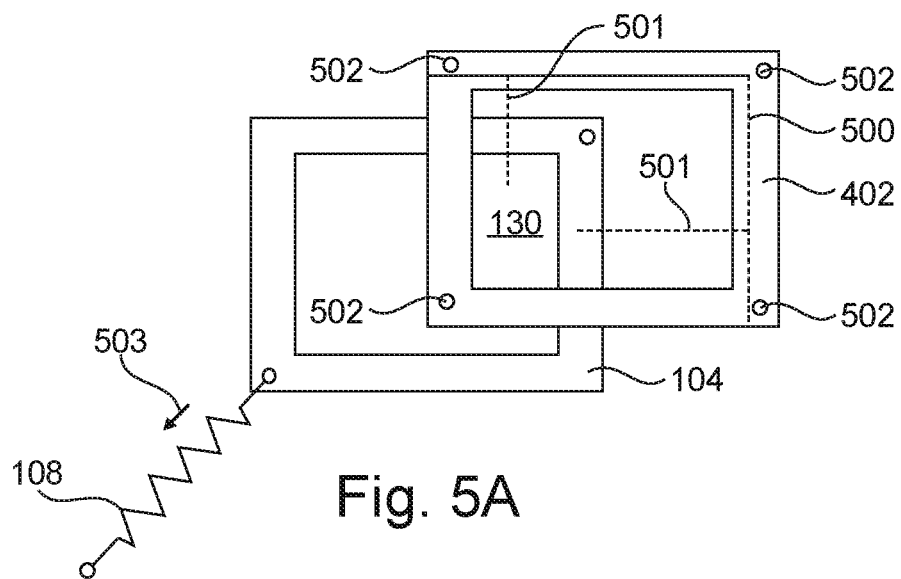
FIG. 5A is a schematic top view of a first rectangular frame being received by a frame shell.
Figure 5B:
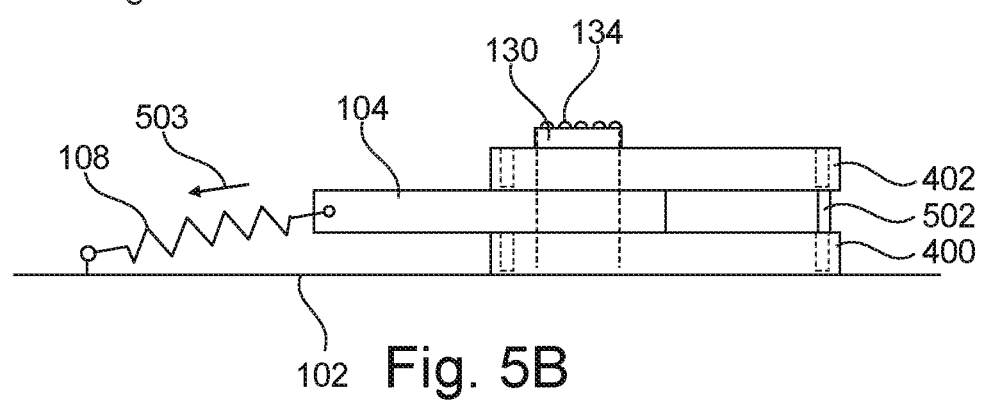
FIG. 5B is a schematic side view of a first rectangular frame being received by a frame shell.

FIGS. 5A and 5B explain the functioning principle of the frame shell 400, 402 in more detail. FIG. 5A is a schematic top view of the first rectangular frame 104 being received by the frame shell 400, 402 and FIG. 5B is a schematic side view of the first rectangular frame 104 being received by the frame shell 400, 402. Both drawings also show the spiral spring 108 and the direction 503 of its restoring force (self-closing configuration). The base element 400 is formed by a third rectangular frame 400 surrounding a third rectangular area. The second and third rectangular areas overlap such that the die 130 can be simultaneously received by the first rectangular frame 104, the second rectangular frame 402 and the third rectangular frame 400. The second rectangular frame 402 and the third rectangular frame 400 have an identical geometry and are aligned by all four inner edges that are respectively facing the second rectangular area and the third rectangular area. In this way, the overlapping horizontal cross section of the available clearance may be maximized, which may allow for a greater flexibility of use regarding compatibility to varying die geometries.

The second rectangular frame 402 and the third rectangular frame 400 are fixed to each other by four spacer pins 502 installed in the four corners of the frames 400, 402. The spacer pins 502 keep the second rectangular frame 402 and the third rectangular frame 400 at a vertical distance just far enough apart that the first rectangular frame 104 may slide between the second rectangular frame and the third rectangular frame 400 along the horizontal degrees of freedom 501 shown by dashed lines with minimal friction. Furthermore, the four spacer pins 502 define the horizontal clearance, also indicated by dashed lines, within which the first rectangular frame 104 may move.

When the restoring force 503 of the spiral spring 108 pulls the first rectangular frame 104 against a die 130 that has been inserted into the first, second and third rectangular areas, the aligned inner edges may allow for fixing the die 130 to the carrier plate 100 by simultaneously pressing the die 130 against said aligned edges. In this way, the force applied to the die 130 by the spiral spring 108 acting through the first rectangular frame 104 may distribute symmetrically through die die's vertical extension, which may reduce the risk of deformation or damage of the die 130 due to mechanical stress.

The invention claimed is:

1. A device for positioning a semiconductor die in a wafer prober, the device comprising a carrier plate, a clamp on a front surface of the carrier plate, and a frame shell, the dimensions of the carrier plate matching a standard geometry required by the wafer prober for receiving a semiconductor wafer to be probed by the wafer prober, the clamp being reversibly movable against a force of an elastic element between an open position and a closed position, the clamp being adapted for fixing the die on the carrier plate in the closed position and for releasing the die in the open position, the clamp comprising a first rectangular frame adapted for receiving the die in a first rectangular area surrounded by the first rectangular frame, the frame shell comprising a base element fixed to the front surface and a second rectangular frame fixed to the base element, the second rectangular frame being stacked on the base element, the first rectangular frame being received between the base element and the second rectangular frame and being movable relative to the frame shell along a degree of freedom parallel to the front surface, the frame shell having, when receiving the first rectangular frame, an overall thickness of less than an overall wafer thickness specified by the standard geometry, the device being adapted for simultaneously receiving the die in the first rectangular area and a second rectangular area surrounded by the second rectangular frame, the first rectangular frame being adapted for fixing the simultaneously received die on the carrier plate in the closed position by pressing the die against the frame shell.

2. The device of claim 1, further comprising a vacuum plate attached to the clamp and resting on the carrier plate, the carrier plate further comprising one or more first vacuum ducts covered by the vacuum plate in the closed state.

3. The device of claim 2, the vacuum plate covering at least 25 percent of the front surface.

4. The device of claim 1, further comprising a stop structure, the clamp being movable toward and away from the stop structure along a degree of freedom parallel to the front surface, the clamp being adapted for fixing the die on the carrier plate in the closed position by pressing the die against the stop structure.

5. The device of claim 4, the front surface comprising a recess forming the stop structure, the recess having a uniform depth of less than an overall wafer thickness specified by the standard geometry.

6. The device of claim 5, wherein, in the area of the recess, the material of the carrier plate is replaced by a material having a higher thermal conductivity than the carrier plate.

7. The device of claim 4, the stop structure protruding from the front surface.

8. The device of claim 7, the stop structure comprising two nonparallel straight segments, the clamp being adapted for fixing the die on the carrier plate in the closed position by simultaneously pressing the chip against both of the segments.

9. The device of claim 4, the degree of freedom comprising a translation.

10. The device of claim 1, the front surface comprising a receiving area, the clamp being adapted, in the closed position, for bringing the die into contact with the receiving area, the device further comprising one or more second vacuum ducts in the receiving area.

11. The device of claim 10, the second vacuum ducts covering between 1 and 50 percent of the receiving area.

12. The device of claim 1, the base element comprising a third rectangular frame surrounding a third rectangular area, the device being adapted for simultaneously receiving the die in the first, the second and the third rectangular area, a first aligned edge of the second rectangular frame being aligned with a second aligned edge of the third rectangular frame, the first rectangular frame being adapted for fixing the simultaneously received die on the carrier plate in the closed position by simultaneously pressing the die against the first aligned edge and the second aligned edge.

13. The device of claim 1, the elastic element being adapted for restoring the clamp into the closed position.

14. The device of claim 1, the clamp being exchangeably mounted on the carrier plate.

15. The device of claim 1, the carrier plate further comprising an alignment mark.

16. The device of claim 1, the carrier plate being a semiconductor wafer or being made of a metal or a ceramic material.

17. The device of claim 16, the metal being aluminum.

18. The device of claim 1, the elastic element having a spring constant between 0.025 and 0.5 newton per millimeter.

* * * * *